(12) United States Patent
Tomoyama et al.

(10) Patent No.: US 11,798,837 B2
(45) Date of Patent: Oct. 24, 2023

(54) METHODS FOR FORMING OPENINGS IN CONDUCTIVE LAYERS AND USING THE SAME

(71) Applicant: Micron Technology, Inc., Boise, ID (US)

(72) Inventors: Tsuyoshi Tomoyama, Hiroshima (JP); Keisuke Otsuka, Okayama (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/491,825

(22) Filed: Oct. 1, 2021

(65) Prior Publication Data

US 2023/0107365 A1 Apr. 6, 2023

(51) Int. Cl.
*H01L 21/768* (2006.01)
*H10B 12/00* (2023.01)

(52) U.S. Cl.
CPC ...... *H01L 21/76811* (2013.01); *H10B 12/485* (2023.02); *H10B 12/03* (2023.02)

(58) Field of Classification Search
CPC .......... H01L 21/76811; H01L 27/1085; H01L 27/10885; H01L 27/10888
USPC .......................................................... 438/712
See application file for complete search history.

(56) References Cited

U.S. PATENT DOCUMENTS

| | | | |
|---|---|---|---|
| 2004/0166668 A1* | 8/2004 | Ito | H01L 27/10852 257/E21.018 |
| 2007/0257302 A1* | 11/2007 | Kang | H01L 27/115 257/E21.627 |
| 2021/0134660 A1* | 5/2021 | Wang | H01L 21/76804 |

\* cited by examiner

*Primary Examiner* — Hoai V Pham
(74) *Attorney, Agent, or Firm* — Dorsey & Whitney LLP

(57) ABSTRACT

Methods for forming openings in conductive layers and using the same are described. An example method includes: forming a conductive layer; forming a first hard mask on the conductive layer; forming a second hard mask on the first hard mask; providing an opening through the first and second masks; and removing a surface of the conductive layer under the opening. The first hard mask may have hardness greater than hardness of the second hard mask.

16 Claims, 13 Drawing Sheets

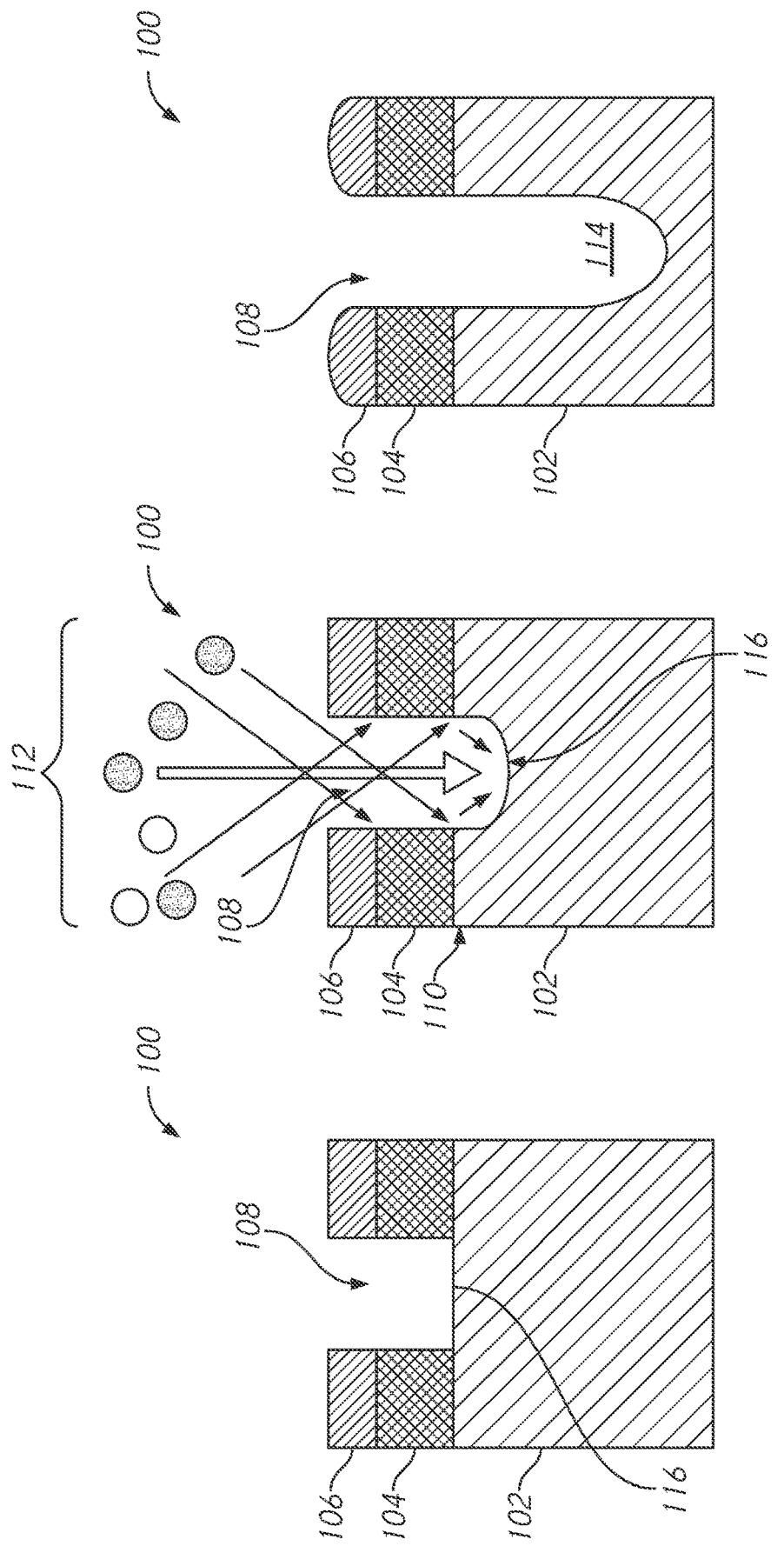

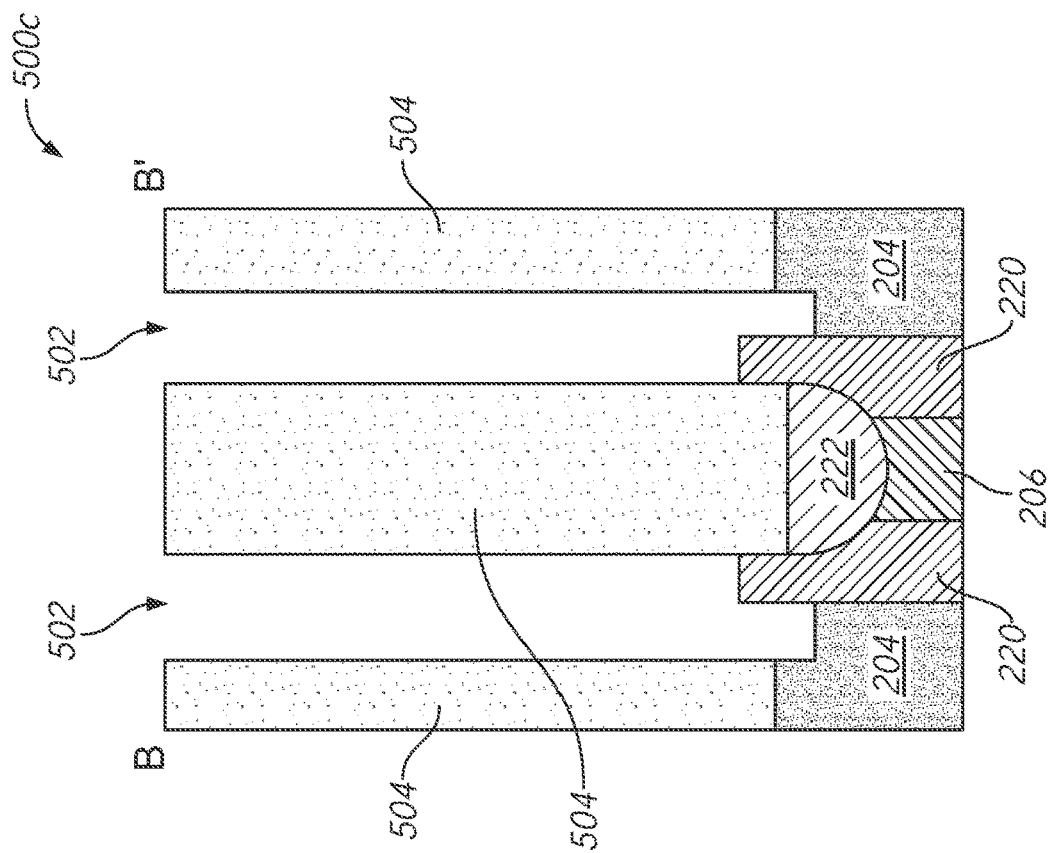
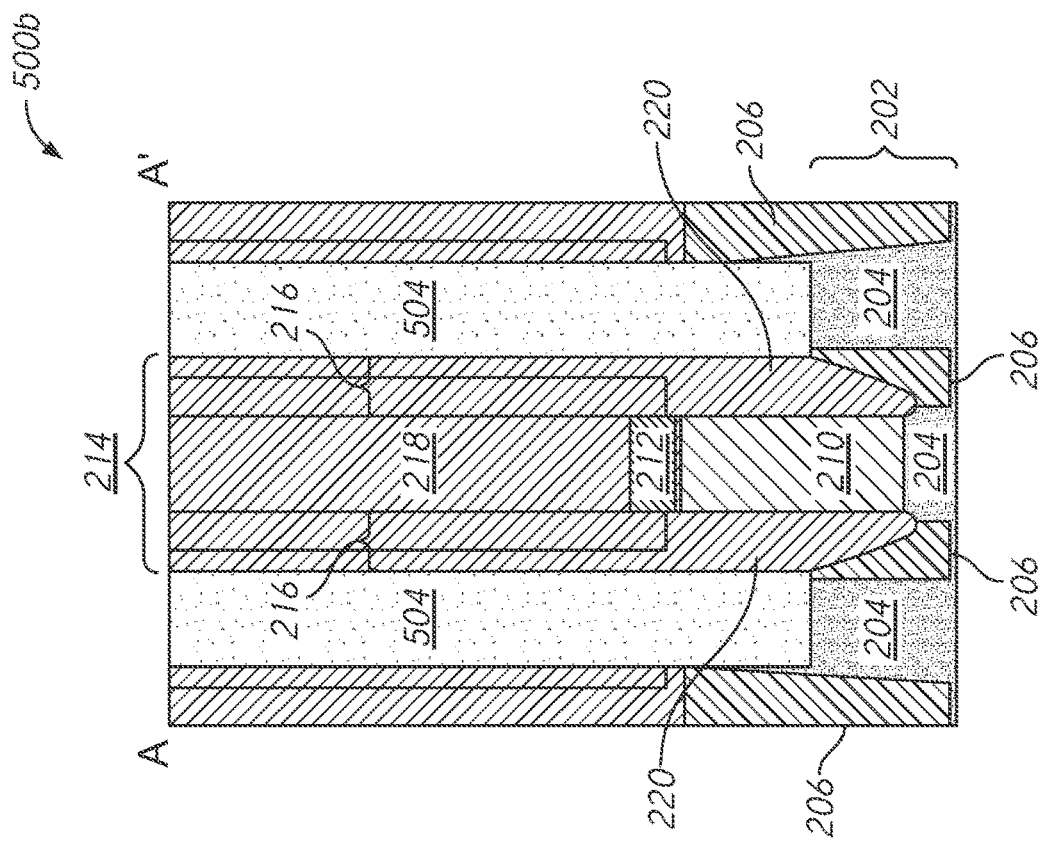
FIG. 5C
FIG. 5B

METHODS FOR FORMING OPENINGS IN CONDUCTIVE LAYERS AND USING THE SAME

BACKGROUND

High data reliability, high speed of data access, lower power consumption and reduced chip size are features that are demanded from semiconductor devices. To reduce chip size, a distance between circuit elements has become shorter.

Semiconductor devices include conductors, such as contact plugs that couple circuits to wirings. Conductors may be formed from conductive material of a conductive layer. In some conventional methods, the conductive material may be formed in openings that are formed in a dielectric layer by etching. In some other conventional methods, conductors may be formed from remaining conductive material of a conductive layer after openings in the conductive layer may be formed by etching. In a conventional method, a conventional hard mask may be used in forming openings in a conductive layer. For example, such conventional hard mask may be a silicon dioxide hard mask (e.g., a TEOS hard mask). The hard mask may be formed on the conductive layer and under a silicon dioxide (SiO2) mask.

The conventional hard mask may be damaged by high energy kinetic energy (e.g., ion, electron, or photon) beams during processing (e.g., etching). As a result, top portions of the conductive layer below the damaged portion of the mask and around the openings tend to be etched excessively. Thus, the top portions of the conductive layer may become overly narrow after the etching process, which is undesirable.

BRIEF DESCRIPTION OF THE DRAWINGS

FIG. 1A is a diagram of a cross-sectional view of one schematic structure of a portion of a semiconductor device in accordance with an embodiment of the present disclosure.

FIG. 1B is a diagram of a cross-sectional view of one schematic structure of a portion of a semiconductor device in accordance with an embodiment of the present disclosure.

FIG. 1C is a diagram of a cross-sectional view of one schematic structure of a portion of a semiconductor device in accordance with an embodiment of the present disclosure.

FIG. 5B is a diagram of a cross-sectional view of one schematic structure of a portion of the semiconductor device in accordance with the embodiment of the present disclosure.

FIG. 5C is a diagram of another cross-sectional view of one schematic structure of a portion of the semiconductor device in accordance with the embodiment of the present disclosure.

DETAILED DESCRIPTION

Figure 2A:
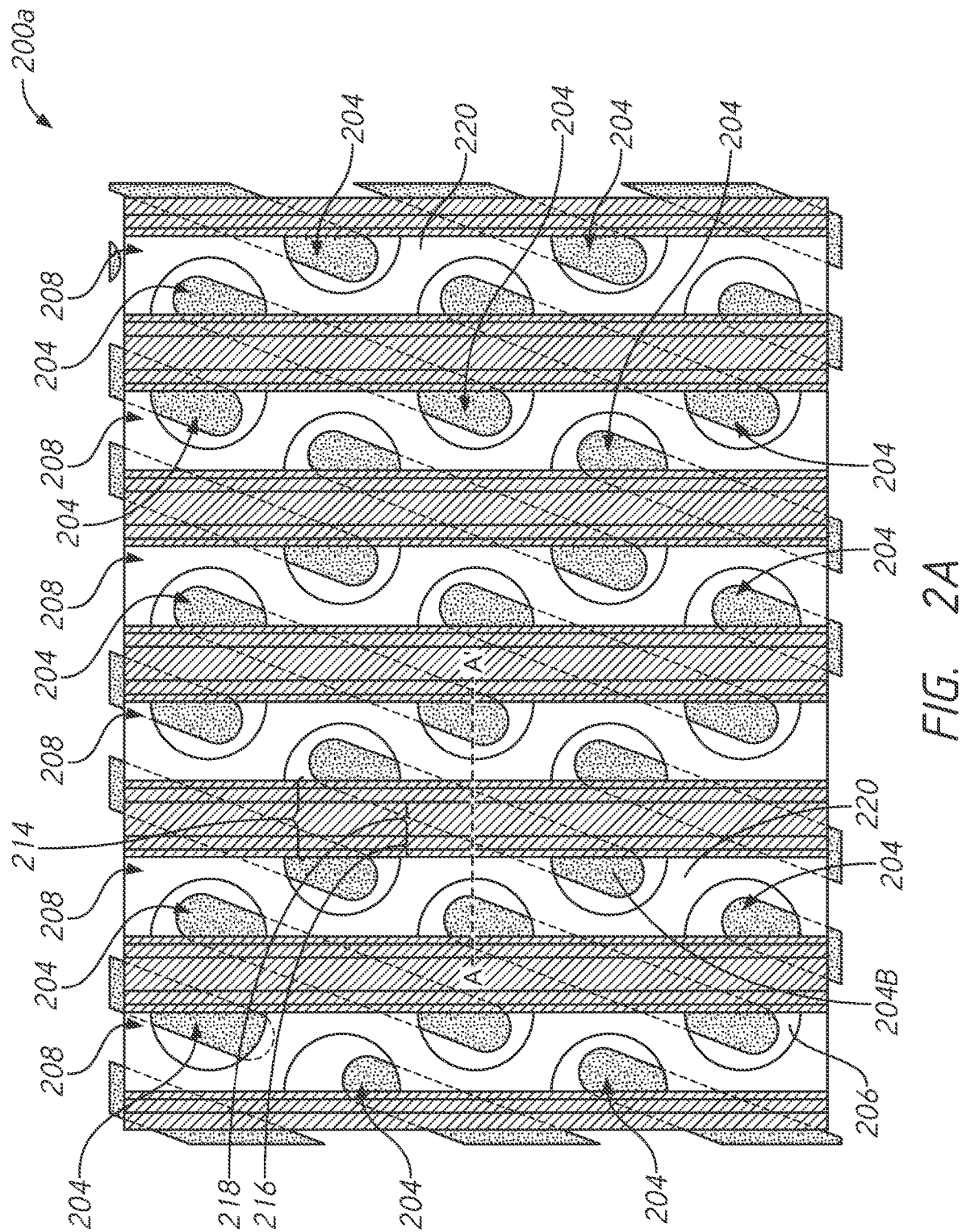
FIG. 2A is a diagram for a layout of a semiconductor device in accordance with an embodiment of the present disclosure.

Various embodiments of the present disclosure will be explained below in detail with reference to the accompanying drawings. The following detailed description refers to the accompanying drawings that show, by way of illustration, specific aspects and embodiments in which the present disclosure may be practiced. These embodiments are described in sufficient detail to enable those skilled in the art to practice the present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

The following describes methods for forming openings in conductive layers according to embodiments with reference to FIG. 1A to FIG. 1C. FIG. 1A is a diagram of a cross-sectional view of one schematic structure of a portion 100 of a semiconductor device in accordance with an embodiment of the present disclosure. The portion 100 includes a conductive layer 102, a hard mask 104 on the conductive layer 102, and another hard mask 106 on the first hard mask 104. In some embodiments, the conductive layer 102 may include polycrystalline silicon (poly-Si). In some embodiments, the poly-Si conductive layer 102 may be p-doped to control conductivity. In some embodiments, the hard mask 104 may include metal. In some embodiments, the hard mask 106 may be silicon oxide (SiO2) or silicon nitride (Si2N3). In some embodiments, the hard mask 104 may include material that has hardness greater than hardness of material included in the conductive layer 102 and greater than hardness of material included in the hard mask 106. The portion 100 may include an opening 108 through the hard masks 104 and 106. In some embodiments, the opening 108 may be provided in the hard masks 104 and 106 using lithography. The conductive layer 102 may include an exposed surface 116 under the opening 108.

FIG. 1B is a diagram of a cross-sectional view of one schematic structure of the portion 100 of the semiconductor device in accordance with an embodiment of the present disclosure. An etching process may be performed from a top surface 110 of the conductive layer 102. In some embodiments, etching may be dry etching. In some embodiments, beams 112 may be applied through the opening 108 during the etching process. The beams 112 may impinge the exposed surface 116 of the conductive layer 102 through the opening 108, and etch the exposed surface 116 of the conductive layer 102. The beams 112 may be charged particle beams that include, at least, electron, ion or proton beams. In some embodiments, the beams 112 may include halogen ion beams, such as fluorine ion beams (F+), chlorine ion beams (Cl+) and/or bromine ion beams (Br+).

FIG. 1C is a diagram of a cross-sectional view of one schematic structure of the portion 100 of the semiconductor device in accordance with an embodiment of the present disclosure. After the etching process, an opening 114 may be formed in the conductive layer 102 under the opening 108. Through the etching process, top and/or side surfaces of the hard mask 106 may be removed. Side surfaces of the hard mask 104 may be less damaged due to the greater hardness of the hard mask 104. If the hard mask 104 has less hardness, the hard mask 104 may be damaged by the beams 112, and the beams 112 may consequently attack the surface 116 of the conductive layer 102 under a damaged portion of the hard mask 104. However, because of the greater hardness of the hard mask 104, the removal of a top portion the conductive layer 102 under the hard mask 104 may be reduced or prevented. Thus, by etching with the hard mask 104, a shape of the opening 114 in the conductive layer 102 may better align with the opening 108 and may result in less excess etching (e.g., etching under the hard mask 104) than etching without the hard mask 104.

The following describes methods of forming apparatuses, such as a semiconductor device applying the above described method for forming openings in conductive layers according to embodiments with reference to FIG. 2A to FIG. 7C. The dimensions and the ratios of dimensions of each portion in each drawing do not necessarily coincide with the dimensions and the ratios of dimensions of the actual semiconductor device. In some embodiment, the semiconductor device may be a memory device (e.g., a dynamic random access memory (DRAM)) including memory cells, for example. Each memory cell may include a transistor and a capacitor.

FIG. 2A is a diagram for a layout of a semiconductor device 200a in accordance with an embodiment of the present disclosure. FIG. 2A may be a top view showing the semiconductor device 200a including a line A-A'.

Figure 2B:
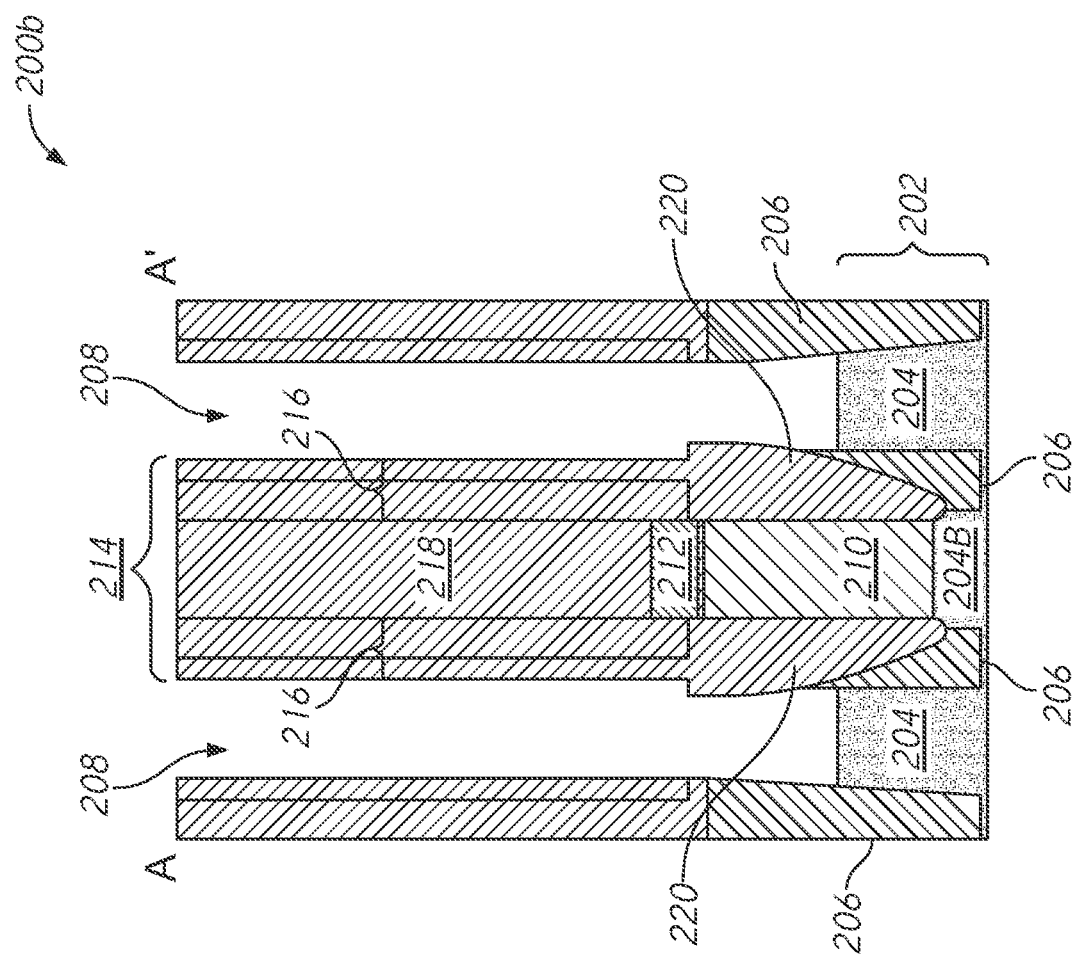
FIG. 2B is a diagram of a cross-sectional view of one schematic structure of a portion of the semiconductor device in accordance with the embodiment of the present disclosure.

FIG. 2B is a diagram of a cross-sectional view of one schematic structure of a portion 200b of the semiconductor device 200a in accordance with the embodiment of the present disclosure. FIG. 2B may be a cross-sectional view showing the portion 200b of the semiconductor device 200a along the line A-A' shown in FIG. 2A.

Figure 7A:
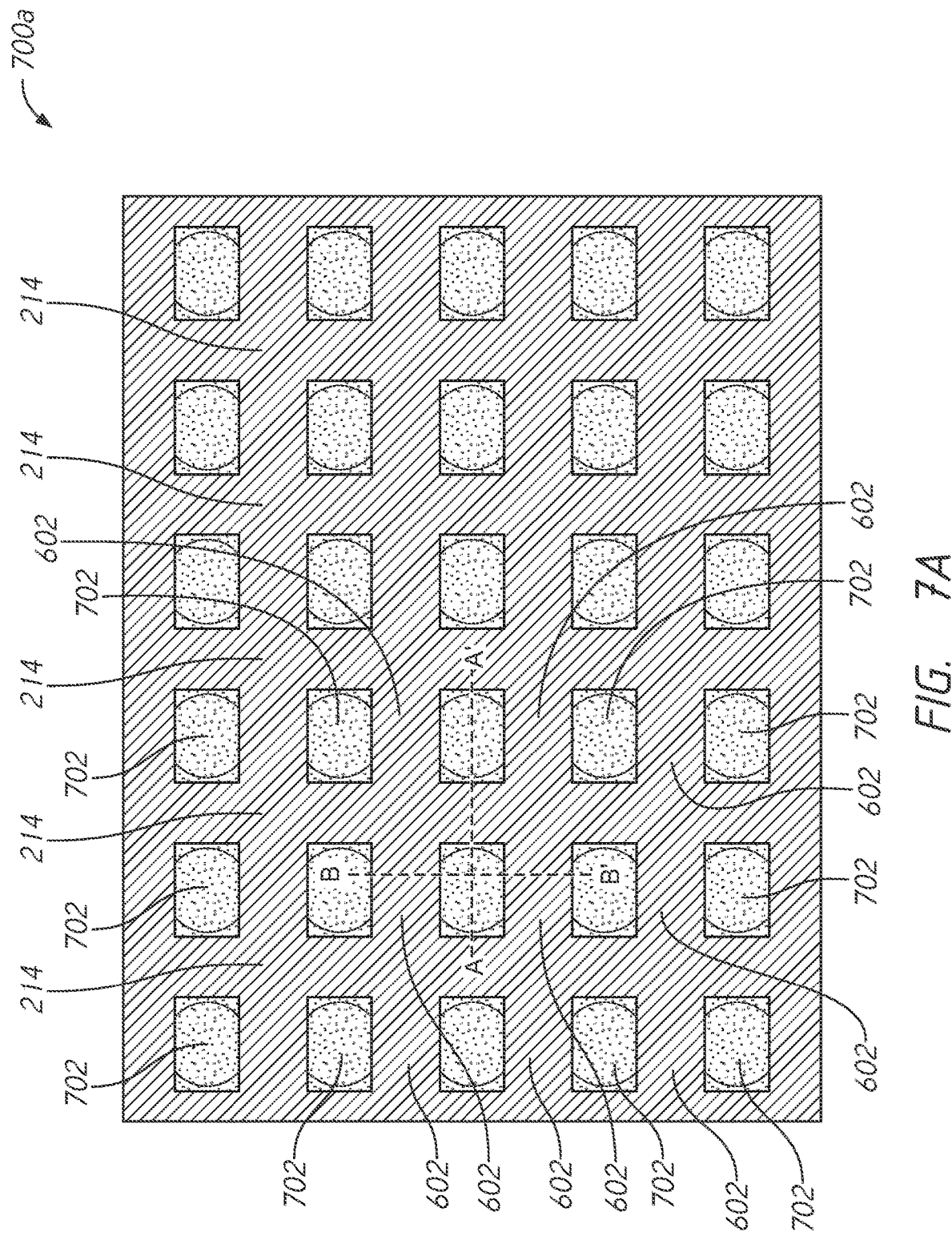
FIG. 7A is a diagram for a layout of a semiconductor device in accordance with an embodiment of the present disclosure.

In some embodiments, the semiconductor device 200a may be an intermediate structure that is used to fabricate a semiconductor device 700a in FIG. 7A. In some embodiments, the semiconductor device 700a in FIG. 7A may be fabricated by performing one or more fabrication processes on the semiconductor device 200a in FIG. 2A. The semiconductor device 200a may be included in a memory array region of a semiconductor device (not shown). Memory cells may be disposed in the memory array region. In some embodiments, the semiconductor device 200a may include a substrate 202 across the memory array region and a peripheral region (not shown) of the semiconductor device. The substrate 202 may include active regions 204 in the memory array region. The semiconductor device 200a may include isolation regions 206 that isolate the active regions 204 from one another. In some embodiments, the isolation regions 206 may be shallow trench isolation (STI) regions including dielectric material.

The portion 200b may include openings 208 and a bit line contact 210 between the openings 208. The openings 208 and the bit line contact 210 may be disposed on corresponding active regions 204. For example, the bit line contact 210, a bit line 212 on the bit line contact 210 and a dielectric film 218 on the bit line 212 may be disposed on an active region 204B. Openings (not shown) may be disposed on corresponding active regions 204 by etching the active regions 204 and the isolation regions 206 around the active regions 204. Conductive material, such as polycrystalline silicon (poly-Si) for example, may be deposited to fill the openings. Another conductive material including metal, such as tungsten (W) for example, may be deposited on the conductive material. Dielectric material, such as silicon nitride (Si2N3) may be deposited on the another conductive material. Portions of the corresponding conductive materials, and the dielectric material may be removed to form the openings 208. In some embodiments, the portions of the corresponding conductive materials and the dielectric material may be removed in a direction perpendicular to the line A-A' on sides the bit line contact 210 and the bit line 212. In some embodiments, the portions of the corresponding conductive materials and the dielectric material may be removed by dry etching. In some embodiments, the openings 208 may extend in the direction perpendicular to the line A-A'. The bit line contact 210, the bit line 212 and the dielectric film 218 may be formed to extend in the direction perpendicular to the line A-A', parallel to the openings 208. An isolation structure 214 may cover the bit line 212. The isolation structure 214 may include the dielectric film 218 and one or more dialectic films 216. The dielectric films 216 may be formed to cover sides of the bit line 212 and side walls of the dielectric film 218. In some embodiments, the dielectric film 216 may include silicon nitride (Si2N3). The isolation structure 214 may extend in the direction perpendicular to the line A-A', parallel to the openings 208. In some embodiments, the openings 208 may be further etched to expose active regions 204 under the openings 208. In some embodiments, the dielectric films 216 may include one or more dielectric films 220 in FIG. 2A that may be formed above the isolation regions 206. The one or more dielectric films 220 may be disposed on sides the bit line contacts 210. The one or more dielectric films 220 may extend in the direction perpendicular to the line A-A'. The one or more dielectric films 220 may provide additional isolation to the bit line contact 210 from conductive layers to be formed in the openings 208 in proximity.

Figure 3A:
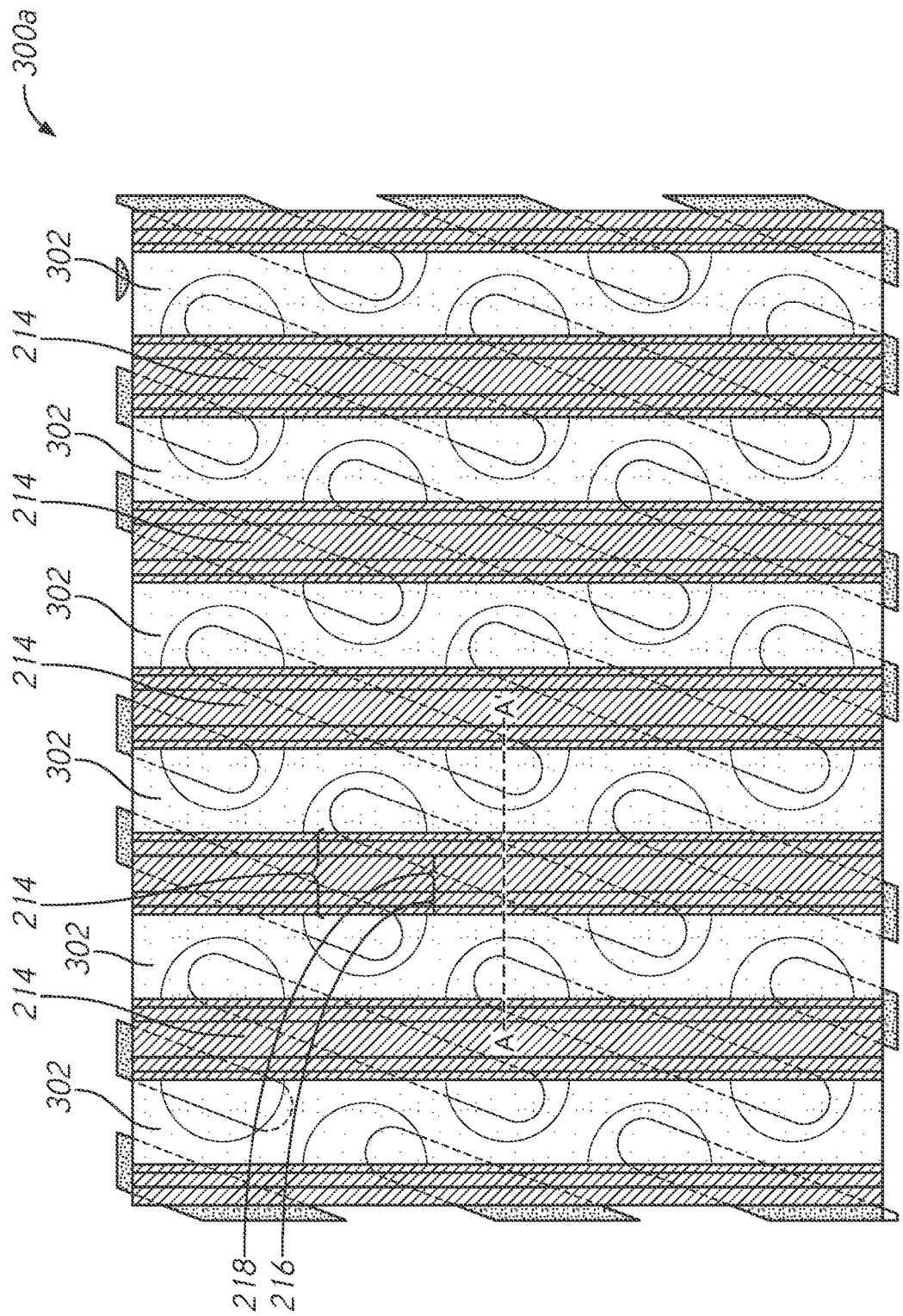
FIG. 3A is a diagram for a layout of a semiconductor device in accordance with an embodiment of the present disclosure.

FIG. 3A is a diagram for a layout of a semiconductor device 300a in accordance with an embodiment of the present disclosure. FIG. 3A may be a top view showing the semiconductor device 300a including a line A-A'.

Figure 3B:
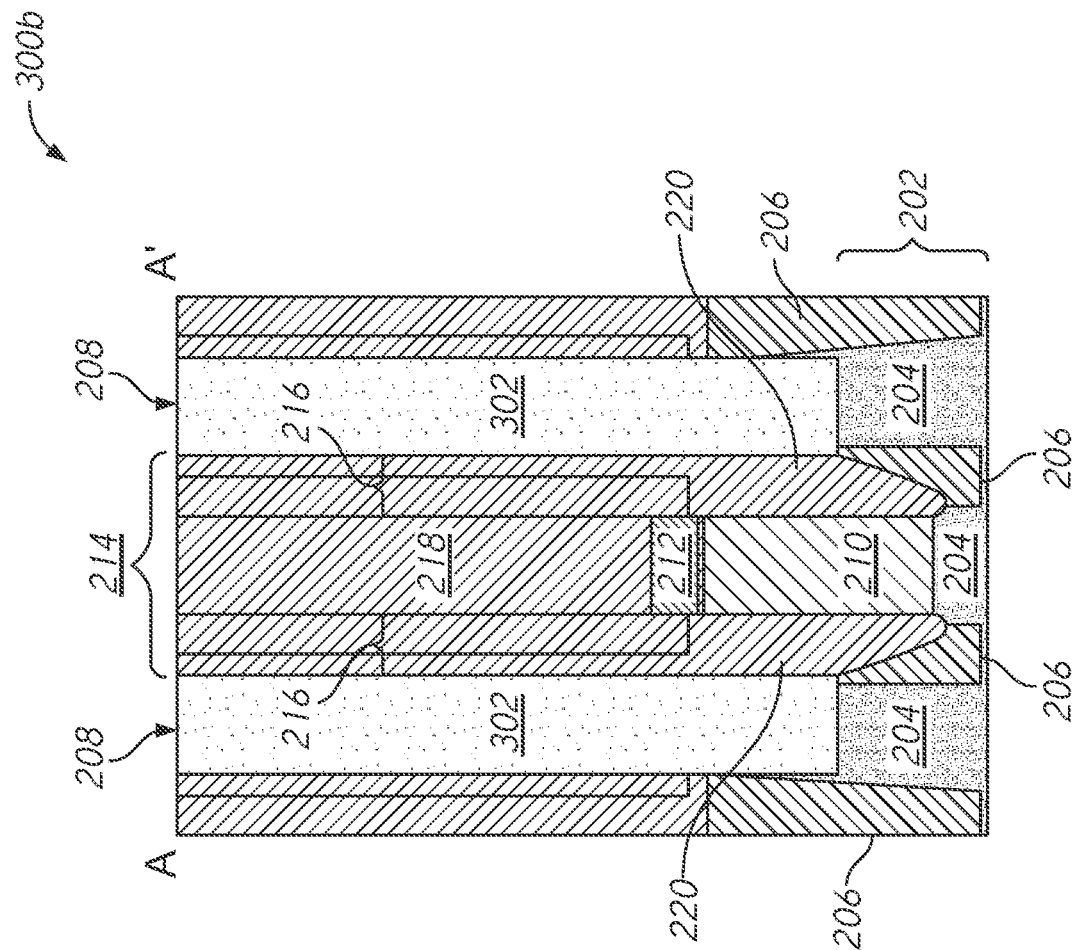
FIG. 3B is a diagram of a cross-sectional view of one schematic structure of a portion of the semiconductor device in accordance with the embodiment of the present disclosure.

FIG. 3B is a diagram of a cross-sectional view of one schematic structure of a portion 300b of the semiconductor device 300a in accordance with the embodiment of the present disclosure. FIG. 3B may be a cross-sectional view showing the portion 300b of the semiconductor device 300a along the line A-A' shown in FIG. 3A. In some embodiments, the semiconductor device 300a may be fabricated by performing one or more fabrication processes on the semiconductor device 200a of FIG. 2A and the portion 300b may be fabricated by performing one or more fabrication processes on the portion 200b of FIG. 2B. In some embodiments, the semiconductor device 300a may be an intermediate structure that is used to fabricate a semiconductor device 700a in FIG. 7A. In some embodiments, the semiconductor device 700a in FIG. 7A may be fabricated by performing one or more fabrication processes on the semiconductor device 300a in FIG. 3A. For example, the semiconductor device 300a may be included in a memory array region of a semiconductor device (not shown).

The semiconductor device 300a may include portions of conductive material 302 disposed in the openings 208 above the active regions 204. The portions of conductive material 302 may be isolated from the bit line contacts 210 on other active regions 204 by the dielectric films 220. The portions of conductive material 302 may be isolated from the bit lines 212 by the isolation structure 214. The portions of conductive material 302 may extend parallel to the bit line contacts 210, the bit lines 212 by the isolation structure 214 perpendicular to the line A-A'. The portions of conductive material 302 may be deposited in the openings 208. In some embodiments, the portions of conductive material 302 may include polycrystalline silicon (poly-Si).

Figure 4A:
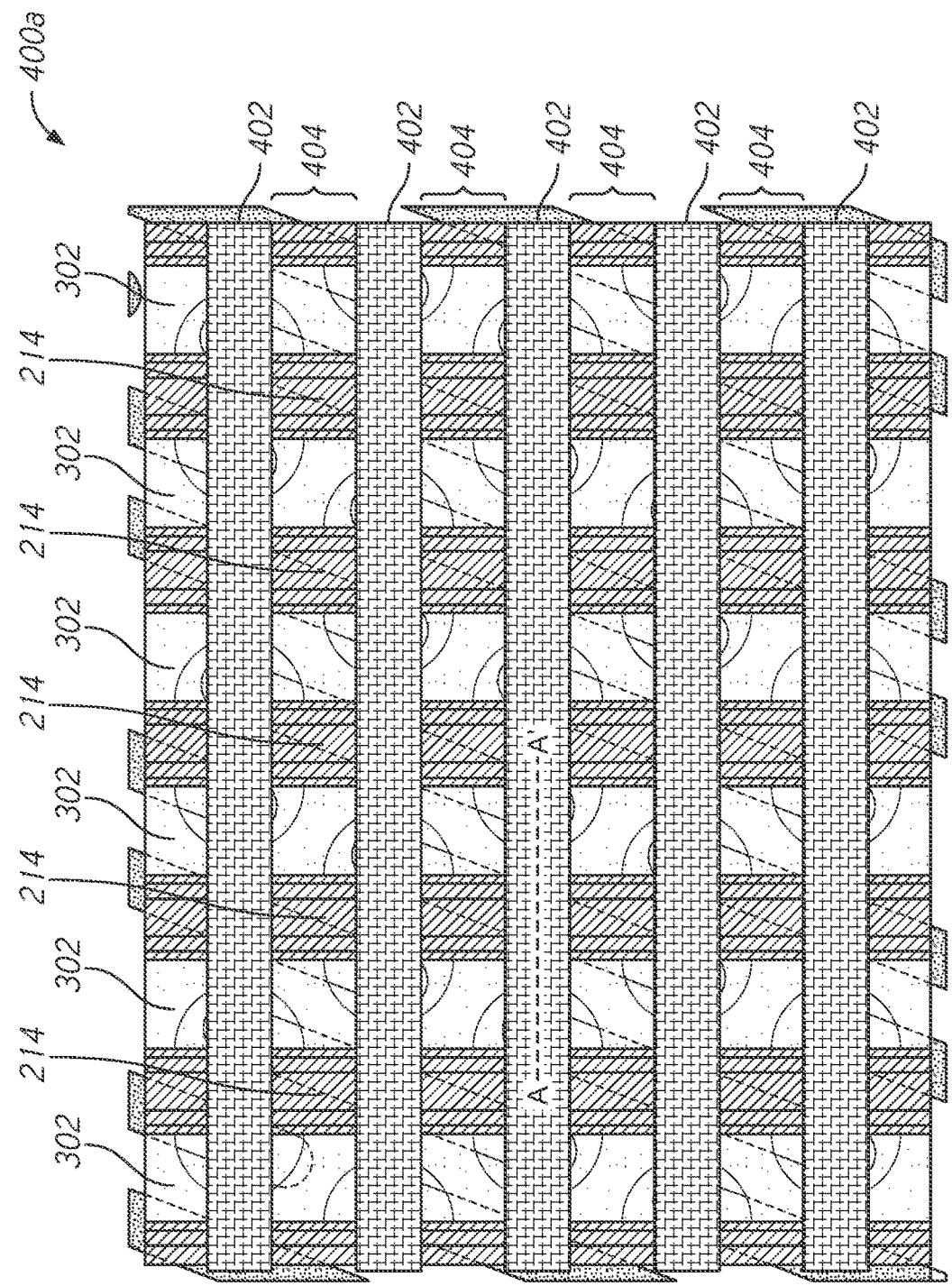
FIG. 4A is a diagram for a layout of a semiconductor device in accordance with an embodiment of the present disclosure.

FIG. 4A is a diagram for a layout of a semiconductor device 400a in accordance with an embodiment of the present disclosure. FIG. 4A may be a top view showing the semiconductor device 400a including a line A-A'.

Figure 4B:
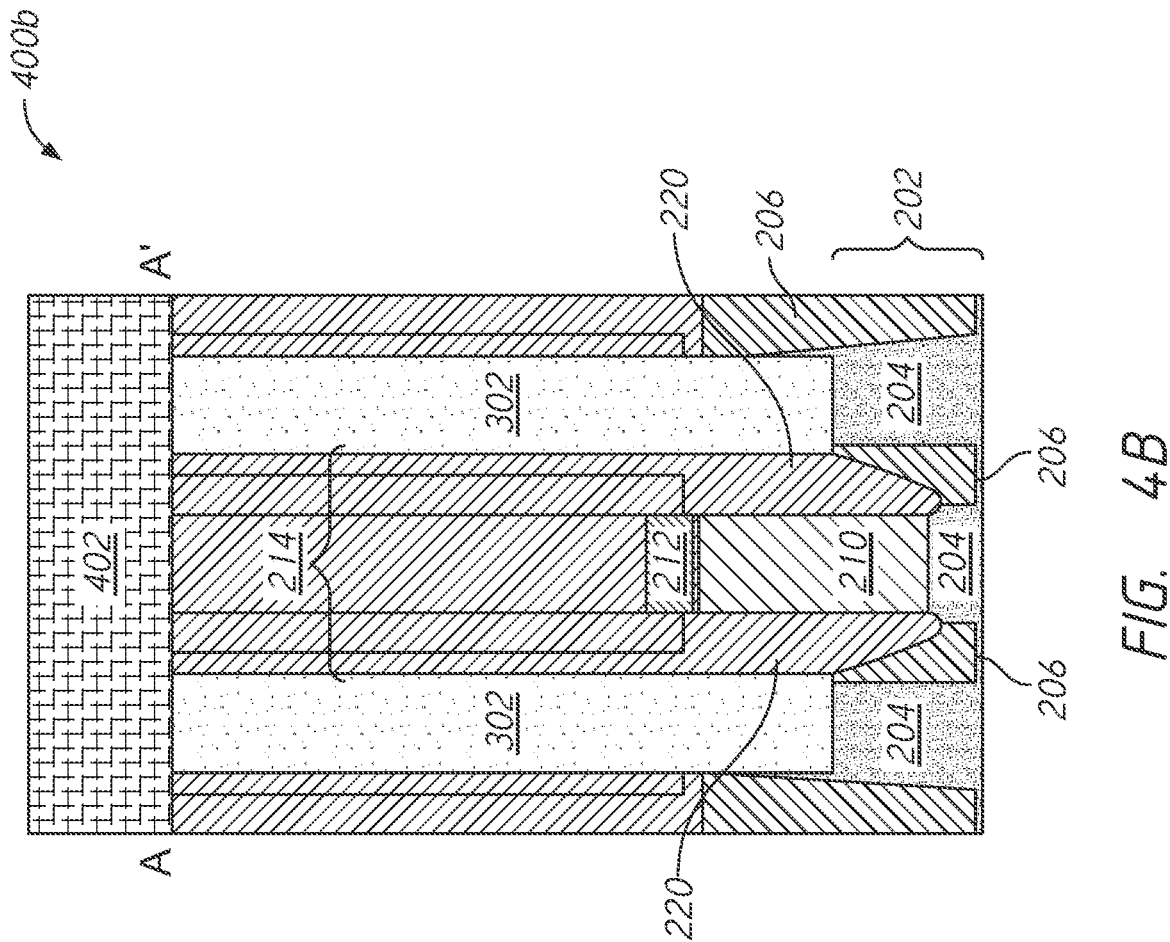
FIG. 4B is a diagram of a cross-sectional view of one schematic structure of a portion of the semiconductor device in accordance with the embodiment of the present disclosure.

FIG. 4B is a diagram of a vertical cross-sectional view of one schematic structure of a portion 400b of the semiconductor device 400a in accordance with the embodiment of the present disclosure. FIG. 4B may be a cross-sectional view showing the portion 400b of the semiconductor device 400a along the line A-A' shown in FIG. 4A. In some embodiments, the semiconductor device 400a may be fabricated by performing one or more fabrication processes on the semiconductor device 300a of FIG. 3A and the portion 400b may be fabricated by performing one or more fabrication processes on the semiconductor device 300b of FIG. 3B. In some embodiments, the semiconductor device 400a may be an intermediate structure that is used to fabricate a semiconductor device 700a in FIG. 7A. In some embodiments, the semiconductor device 700a in FIG. 7A may be fabricated by performing one or more fabrication processes on the semiconductor device 400a in FIG. 4A. For example, the semiconductor device 400a may be included in a memory array region of a semiconductor device (not shown).

The semiconductor device 400a may include hard masks 402 disposed above the isolation structures 214 and the portions of conductive material 302. The hard masks 402 may extend parallel to the line A-A', which extends in a direction perpendicular to the direction that the isolation structure 214 and the portions of conductive material 302 extend. In some embodiments, the hard masks 402 may include hard masks 104 of FIGS. 1A-1C disposed on the isolation structure 214 and the portions of conductive material 302. In some embodiments, the hard masks 104 included in the hard masks 402 may include metal. In some embodiments, the hard masks 402 may further include hard masks 106 of FIGS. 1A-1C, including silicon oxide (SiO2) or silicon nitride (Si2N3), on the corresponding hard masks 104. In some embodiments, the hard masks 402 may include material that has hardness greater than hardness of the conductive material 302. The semiconductor device 400a may include an opening pattern including openings 404 between the hard masks 402. Each opening 404 may be etched as the opening 108 of FIGS. 1A-1C.

Figure 5A:
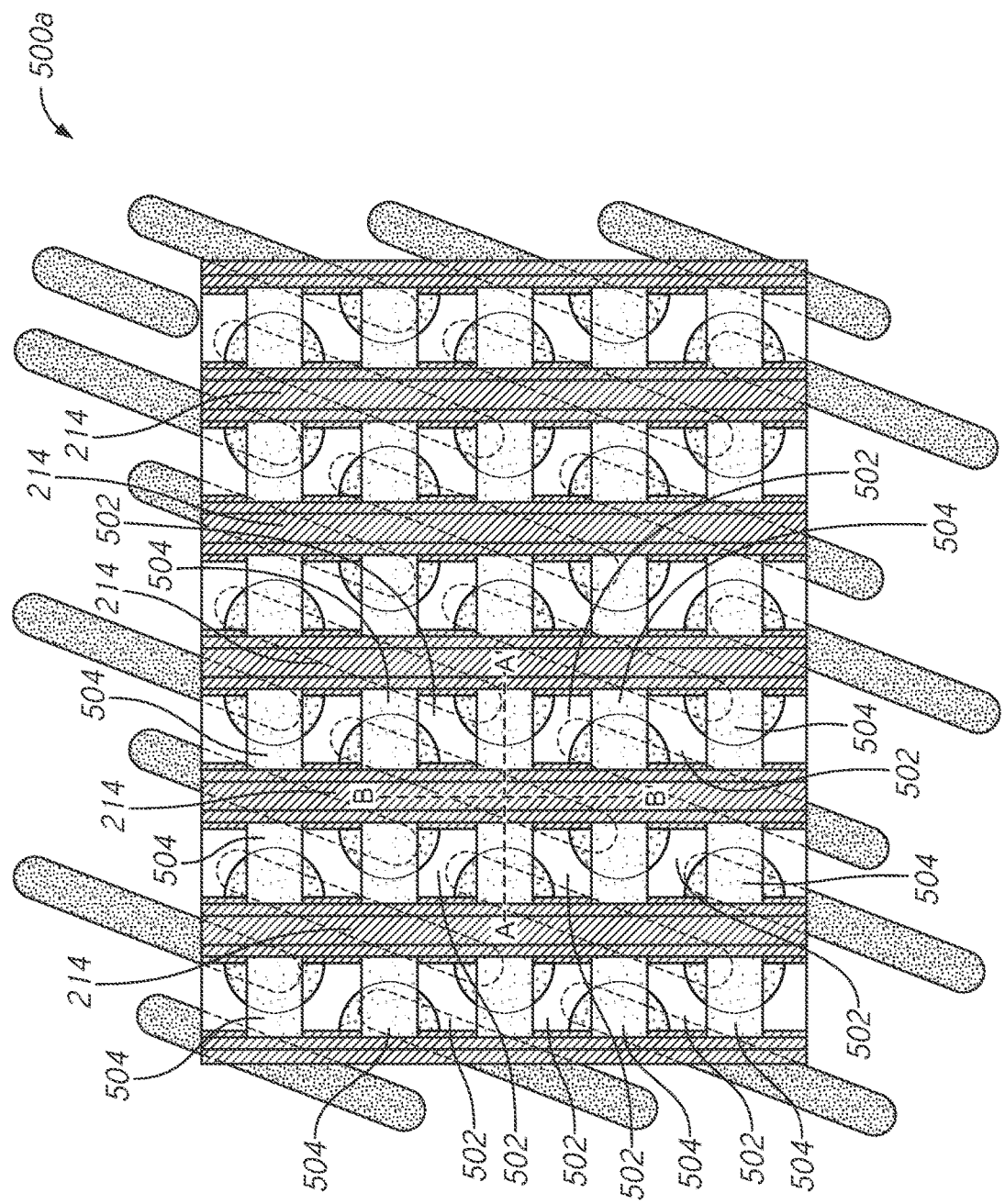
FIG. 5A is a diagram for a layout of a semiconductor device in accordance with an embodiment of the present disclosure.

FIG. 5A is a diagram for a layout of a semiconductor device 500a in accordance with an embodiment of the present disclosure. FIG. 5A may be a top view showing the semiconductor device 500a including a line A-A' and another line B-B' perpendicular to the line A-A'. In some embodiment, the line A-A' and the line B-B' may cross each other.

FIG. 5B is a diagram of a vertical cross-sectional view of one schematic structure of a portion 500b of the semiconductor device 500a in accordance with the embodiment of the present disclosure. FIG. 5B may be a cross-sectional view showing the portion 500b of the semiconductor device 500a along the line A-A' shown in FIG. 5A.

FIG. 5C is a diagram of another vertical cross-sectional view of one schematic structure of a portion 500c of the semiconductor device 500a in accordance with the embodiment of the present disclosure. FIG. 5C may be a cross-sectional view showing the portion 500c of the semiconductor device 500a along the line B-B' shown in FIG. 5A.

In some embodiments, the semiconductor device 500a may be fabricated by performing one or more fabrication processes on the semiconductor device 400a of FIG. 4A and the portion 500b may be fabricated by performing one or more fabrication processes on the portion 400b of FIG. 4B. In some embodiments, the semiconductor device 500a may be an intermediate structure that is used to fabricate a semiconductor device 700a in FIG. 7A. In some embodiments, the semiconductor device 700a in FIG. 7A may be fabricated by performing one or more fabrication processes on the semiconductor device 500a in FIG. 5A. For example, the semiconductor device 500a may be included in a memory array region of a semiconductor device (not shown).

The semiconductor device 500a may include openings 502 formed by etching the portions of conductive material 302 through the hard masks 402. As shown in FIG. 5C, each conductive film 504 in a pillar shape is disposed between the openings 502. An etching process to form the openings 502 may be performed as explained with reference to FIGS. 1B-1C. In some embodiments, etching may be dry etching. In some embodiments, beams, such as the beams 112 of FIGS. 1B-1C, may be applied through the openings 404 between the hard masks 402 in FIGS. 4A-4B during the etching process. The beams may be charged particle beams that include, at least, electron, ion or proton beams. In some embodiments, the beams may include halogen ion beams, such as fluorine ion beams (F+), chlorine ion beams (Cl+) and/or bromine ion beams (Br+). By impinging top surfaces of portions of the conductive material 302 uncovered by the hard masks 402 in FIGS. 4A-4B by the beams, the conductive material 302 uncovered may be removed. After the removal of the uncovered conductive material 302, the openings 502 of FIGS. 5A and 5C may be formed in place of the removed conductive material 302, and conductive films 504 may be formed as the remaining portions of the conductive material 302 under the hard masks 402. Thus, each portion of the conductive material 302 may be divided into the conductive films 504 by the openings 502. The conductive films 504 from each portion of the conductive material 302 may be disposed in a direction parallel to the line B-B'.

Through the etching process, side surfaces of the hard masks 402 may be less damaged due to the greater hardness.

Because of the greater hardness of the hard masks 402, the removal of the conductive material 302 under the hard masks 402 may be reduced or prevented, and the openings 502 may better reflect the shape of the opening patterns.

Figure 6A:
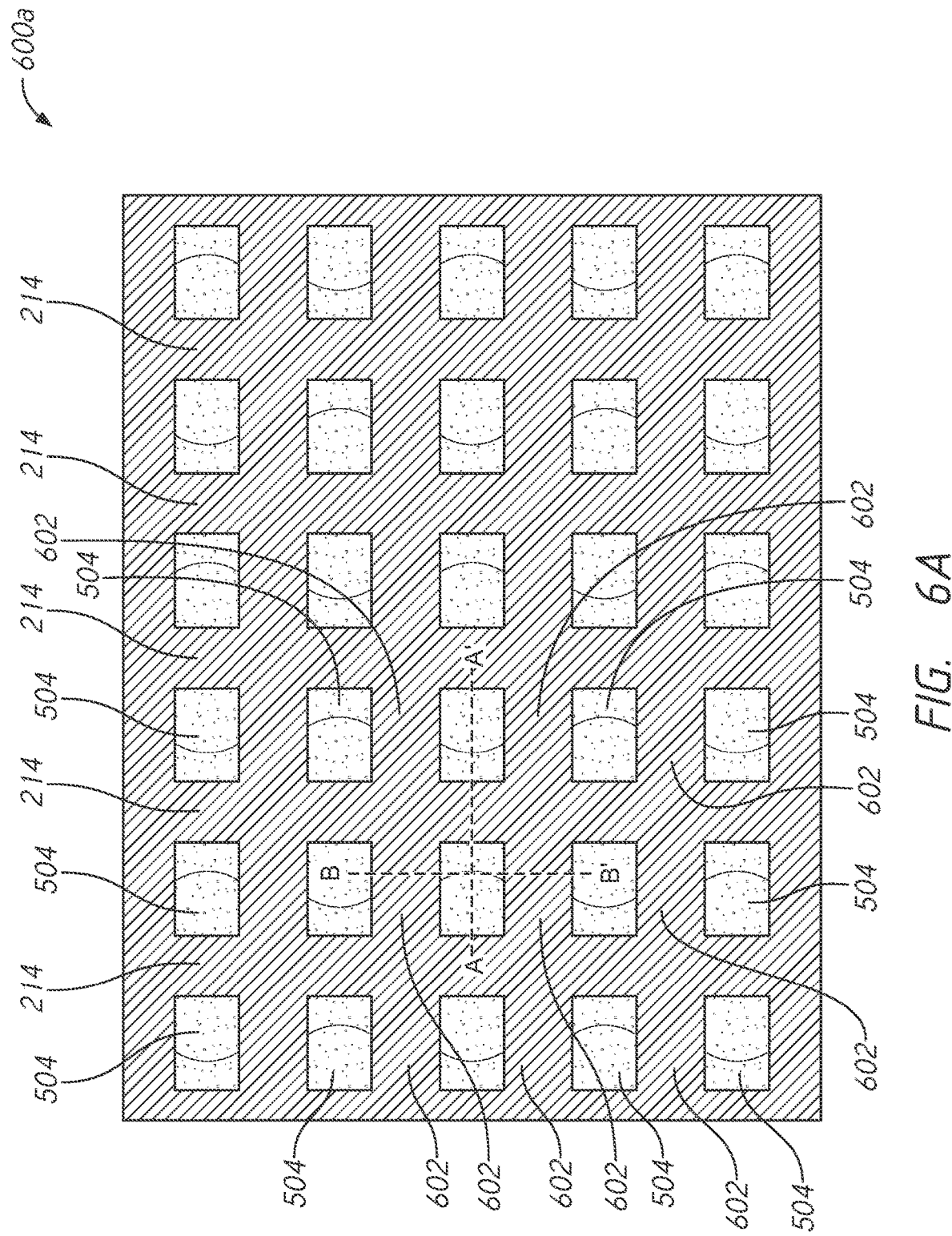
FIG. 6A is a diagram for a layout of a semiconductor device in accordance with an embodiment of the present disclosure.

FIG. 6A is a diagram for a layout of a semiconductor device 600a in accordance with an embodiment of the present disclosure. FIG. 6A may be a top view showing the semiconductor device 600a including a line A-A' and another line B-B' perpendicular to the line A-A'. In some embodiment, the line A-A' and the line B-B' may cross each other.

Figure 6C:
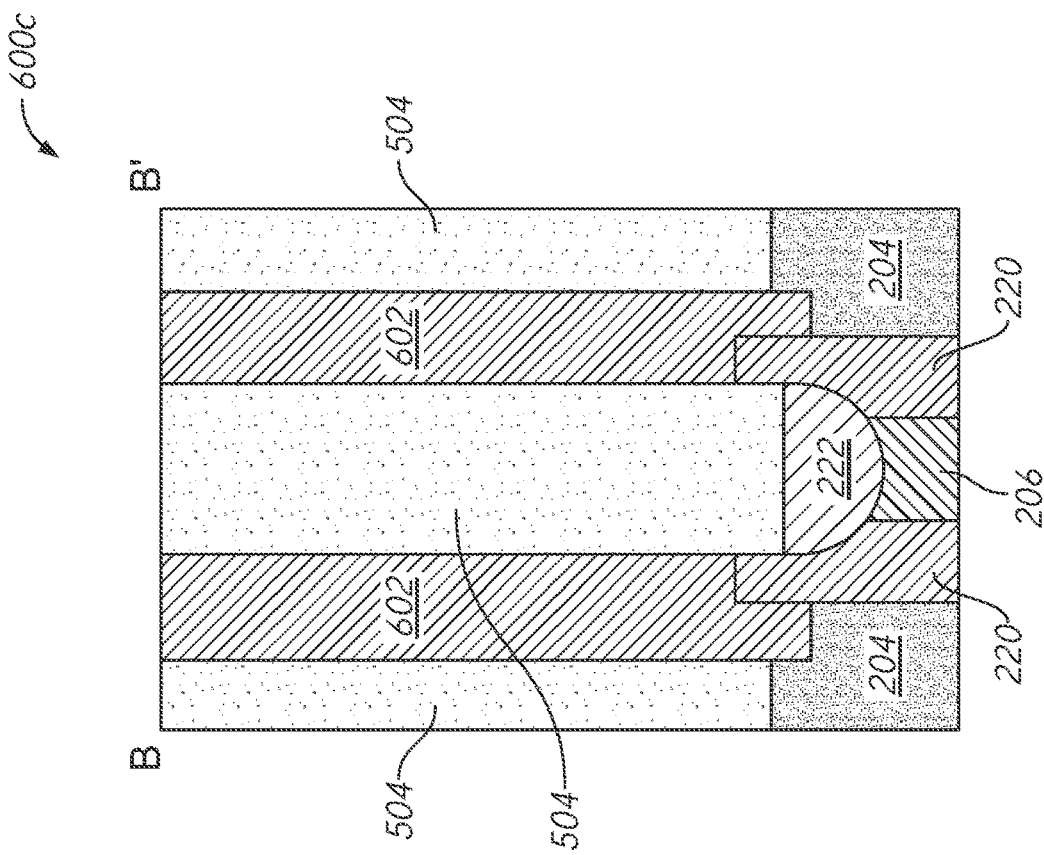
FIG. 6C is a diagram of another cross-sectional view of one schematic structure of a portion of the semiconductor device in accordance with the embodiment of the present disclosure.
Figure 6B:
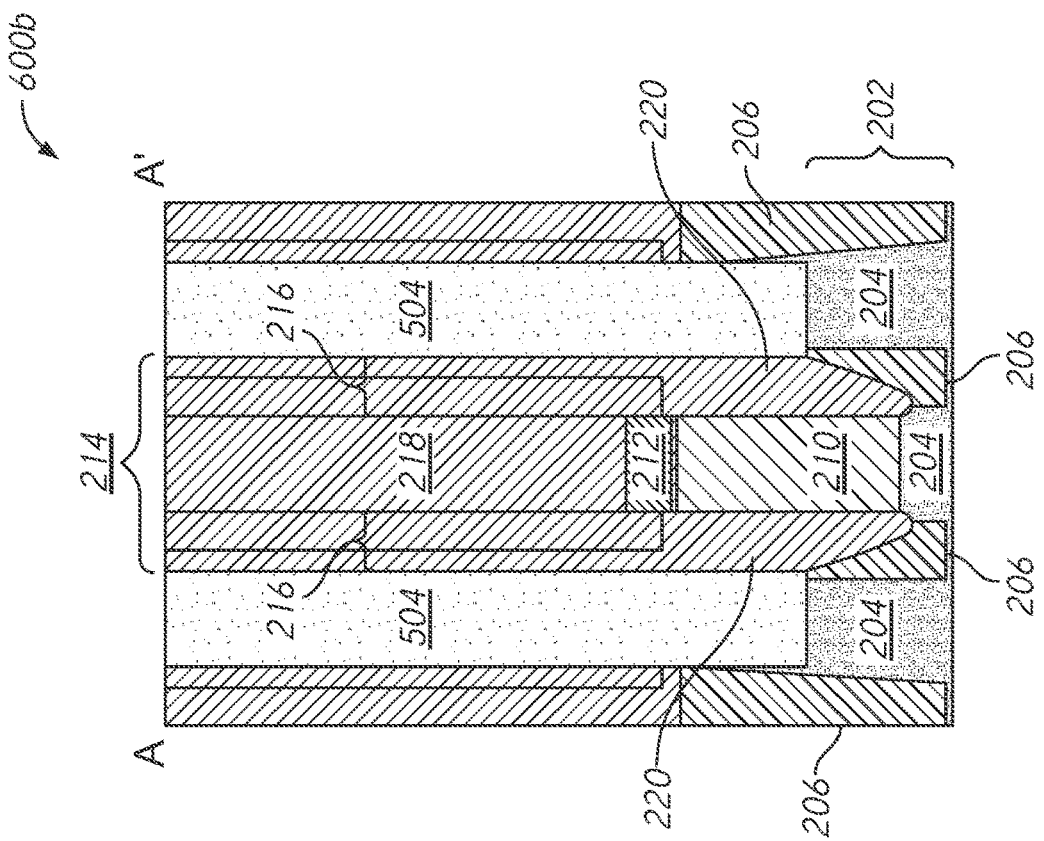
FIG. 6B is a diagram of a cross-sectional view of one schematic structure of a portion of the semiconductor device in accordance with the embodiment of the present disclosure.

FIG. 6B is a diagram of a vertical cross-sectional view of one schematic structure of a portion 600b of the semiconductor device 600a in accordance with the embodiment of the present disclosure. FIG. 6B may be a cross-sectional view showing the portion 600b of the semiconductor device 600a along the line A-A' shown in FIG. 6A.

FIG. 6C is a diagram of another vertical cross-sectional view of one schematic structure of a portion 600c of the semiconductor device 600a in accordance with the embodiment of the present disclosure. FIG. 6C may be a cross-sectional view showing the portion 600c of the semiconductor device 600a along the line B-B' shown in FIG. 6A.

In some embodiments, the semiconductor device 600a may be fabricated by performing one or more fabrication processes on the semiconductor device 500a of FIG. 5A, the portion 600b may be fabricated by performing one or more fabrication processes on the portion 500b of FIG. 5B and the portion 600c may be fabricated by performing one or more fabrication processes on the portion 500c of FIG. 5C. In some embodiments, the semiconductor device 600a may be an intermediate structure that is used to fabricate a semiconductor device 700a in FIG. 7A. In some embodiments, the semiconductor device 700a in FIG. 7A may be fabricated by performing one or more fabrication processes on the semiconductor device 600a in FIG. 6A. For example, the semiconductor device 600a may be included in a memory array region of a semiconductor device (not shown).

The semiconductor device 600a may include dielectric films 602 in a pillar shape disposed in the openings 502 above the active regions 204 and the dielectric films 220. Each conductive film 504 may be isolated from adjacent conductive films 504 along the line B-B' by the dielectric films 602. The conductive films 504 may be isolated from adjacent the bit line contacts 210 and the bit lines 212 along line A-A' by the isolation structures 214 extending parallel to the line B-B'. The dielectric films 602 may be formed by depositing dielectric material in the openings 502. In some embodiments, the dielectric films 602 may include silicon nitride (Si2N3).

FIG. 7A is a diagram for a layout of a semiconductor device 700a in accordance with an embodiment of the present disclosure. FIG. 7A may be a top view showing the semiconductor device 700a including a line A-A' and another line B-B' perpendicular to the line A-A'. In some embodiment, the line A-A' and the line B-B' may cross each other.

Figure 7B:
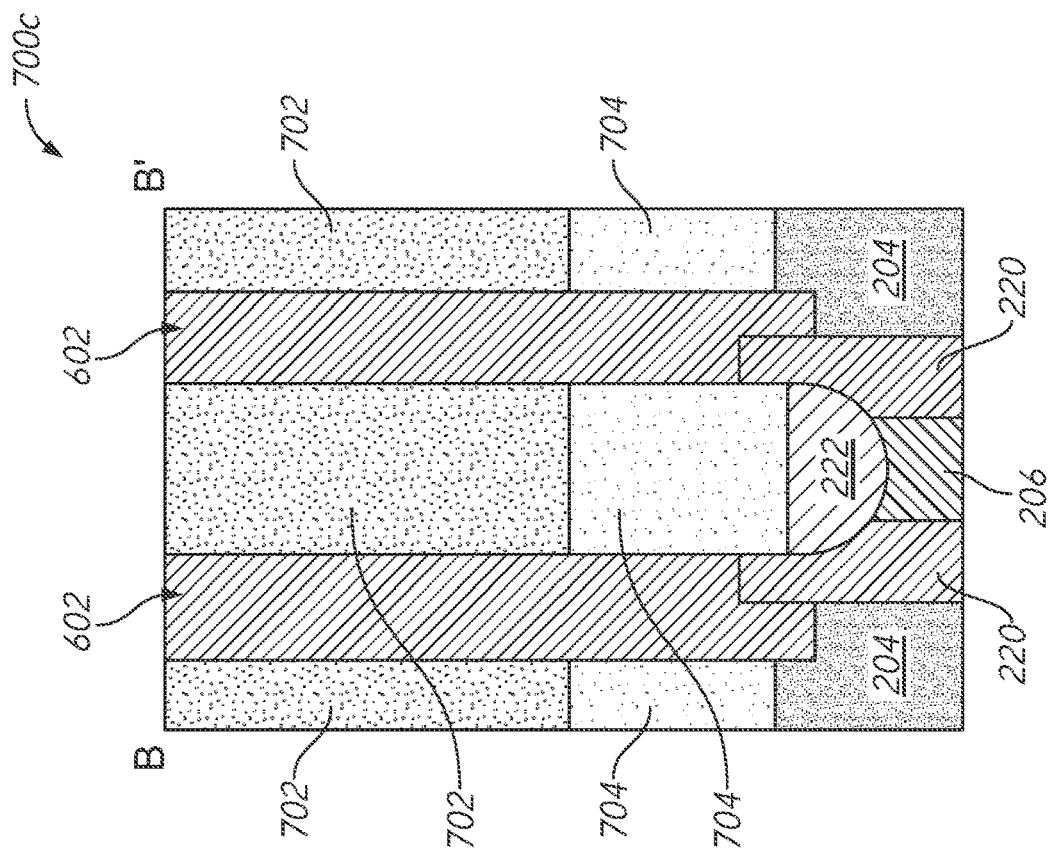
FIG. 7B is a diagram of a cross-sectional view of one schematic structure of a portion of the semiconductor device in accordance with the embodiment of the present disclosure.

FIG. 7B is a diagram of a vertical cross-sectional view of one schematic structure of a portion 700b of the semiconductor device 700a in accordance with the embodiment of the present disclosure. FIG. 7B may be a cross-sectional view showing the portion 700b of the semiconductor device 600a along the line A-A' shown in FIG. 7A.

Figure 7C:
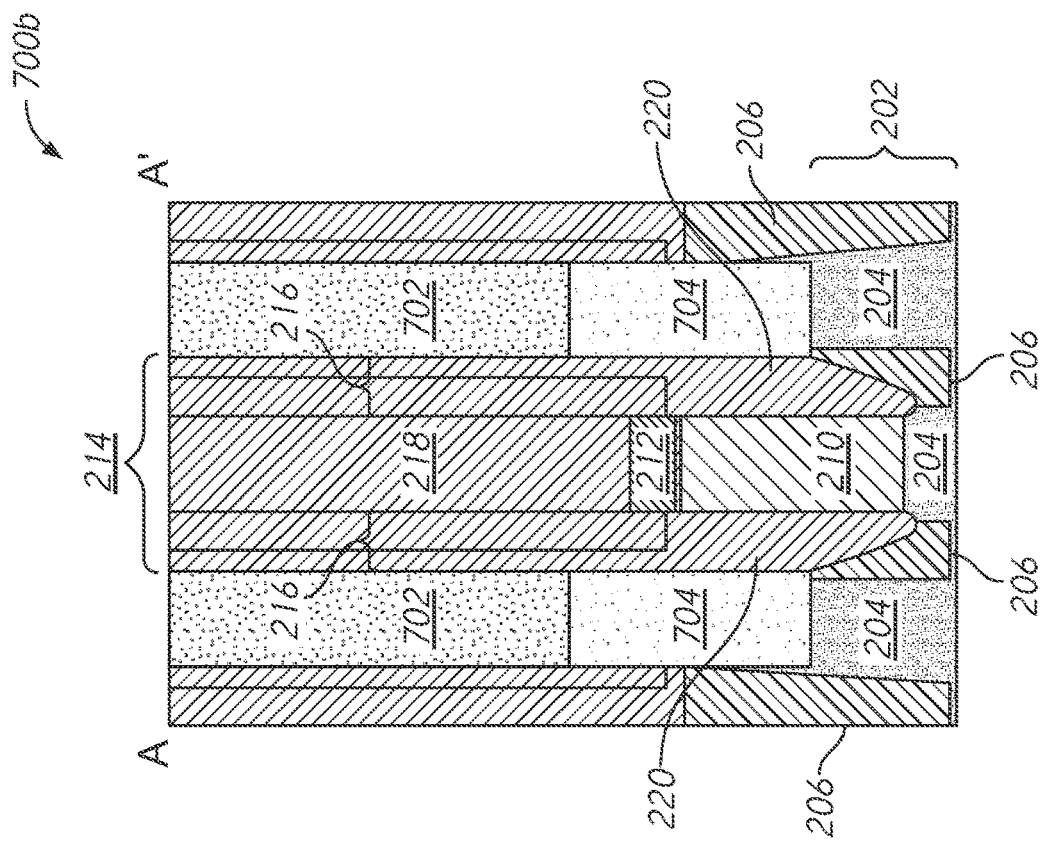
FIG. 7C is a diagram of another cross-sectional view of one schematic structure of a portion of the semiconductor device in accordance with the embodiment of the present disclosure.

FIG. 7C is a diagram of another vertical cross-sectional view of one schematic structure of a portion 700b of the semiconductor device 700a in accordance with the embodiment of the present disclosure. FIG. 7C may be a cross-sectional view showing the portion 700c of the semiconductor device 700a along the line B-B' shown in FIG. 7A.

In some embodiments, the semiconductor device 700a may be fabricated by performing one or more fabrication processes on the semiconductor device 600a of FIG. 6A, the portion 700b may be fabricated by performing one or more fabrication processes on the portion 600b of FIG. 6B and the portion 700c may be fabricated by performing one or more fabrication processes on the portion 600c of FIG. 6C.

The semiconductor device 700a may include capacitor contacts 704 and conductive layers 702 on the corresponding capacitor contacts 704. In some embodiments, the conductive layers 702 may be redistribution layers (RDLs). In some embodiments, the conductive layers 702 may include at least one of tungsten (W), titanium (Ti) or titanium nitride (TiN), for example.

Top portions of the conductive films 504 may be etched to form openings (not shown) in place of the removed top portions of the conductive films 504. After the removal of the top portions of the conductive films 504, the capacitor contacts 704 may be formed as the remaining portions of the conductive films 504 under the openings. A conductive material, such as at least one of tungsten (W), titanium (Ti) or titanium nitride (TiN), may be deposited in the openings, thus the conductive layers 702 may be formed. The conductive layers 702 may electrically couple the capacitor contacts 704 to other circuit elements may be formed.

Unlike forming a dielectric layer, etching the dielectric layer to create openings and forming capacitor contacts in the openings, the above process including forming portions of conductive material 302 and dividing the portions of conductive material 302 by etching using hard masks 402 may provide more precise etching reflecting opening patterns due to greater hardness of the hard masks 402 provided prior to etching uncovered conductive material 302 including polycrystalline silicon (poly-Si). By precise etching, circuit elements, such as the capacitor contacts 704, the conductive layers 702 and the dielectric films 602 in pillar shapes may be formed with higher precision, for example, side walls may be more vertical. Thus, such precise forming circuit elements in pillar shapes may contribute to reduction of chip size by accommodating shorter distances between circuit elements.

In some embodiments of the disclosure, providing two hard masks with different hardness (e.g., one hard mask having greater hardness than the other) during an etching process may result in openings that are better aligned with a pattern of the hard mask. For example, because of the greater hardness of the additional hard mask, excess etching of a conductive layer under the additional hard mask may be reduced or prevented, and an area of an opening may better reflect an opening pattern of the additional hard mask.

Although various embodiments have been disclosed in the present disclosure, it will be understood by those skilled in the art that the scope of the disclosure extends beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or subcombination of the specific features and aspects of the embodiments may be made and still fall within the scope of the disclosure. It should be understood that various features and aspects of the disclosed embodiments can be combined with or substituted for one another in order to form varying embodiments. Thus, it is intended that the scope of at least some of the present disclosure should not be limited by the particular disclosed embodiments described above.

What is claimed is:

1. A method comprising:
forming a conductive layer;
forming a first hard mask on the conductive layer;
forming a second hard mask on the first hard mask;
providing a first opening through the first and second hard masks by lithography; and
removing a surface of the conductive layer under the first opening to provide a second opening in the conductive layer under the first opening, removing comprising applying one or more charged particle beams through the first opening,
wherein the first hard mask has hardness greater than hardness of the second hard mask.

2. The method of claim 1, wherein the hardness of the first hard mask is greater than hardness of the conductive layer.

3. The method of claim 1, wherein the conductive layer comprises polycrystalline silicon.

4. The method of claim 1, wherein the first hard mask comprises metal.

5. The method of claim 1, wherein the second hard mask comprises silicon oxide.

6. The method of claim 1, wherein the one or more charged particle beams comprise ion beams.

7. The method of claim 6, wherein the ion beams comprise halogen ion beams.

8. A method comprising:
forming a bit line contact, a bit line on the bit line contact, and a dielectric film on the bit line contact by forming first openings extending in a first direction on sides of the bit line contact, the bit line and the dielectric film;
forming one or more dielectric films on the sides of the bit line contact and the bit line and the dielectric film in the first openings;
depositing conductive material in the first openings;
providing a plurality of first hard masks on the conductive material and a plurality of second hard masks on the plurality of corresponding first hard masks with second openings extending in a second direction;
removing the conductive material under the second openings to form third openings; and
depositing dielectric material in the third openings.

9. The method of claim 8, wherein the first hard mask has hardness greater than hardness of the second hard mask.

10. The method of claim 9, wherein the first hard mask comprises metal.

11. The method of claim 8, wherein the second hard mask comprises silicon oxide.

12. The method of claim 8, wherein the first hard mask has hardness greater than hardness of the conductive material.

13. The method of claim 12, wherein the conductive material comprise polycrystalline silicon.

14. The method of claim 8, further comprising:
removing top portions of the conductive material to form capacitor contacts; and
depositing another conductive material to form redistribution layers on the corresponding capacitor contacts.

15. The method of claim 8, wherein the conductive material is the first material, and
wherein forming the bit line contact, the bit line and the dielectric film comprises:
forming second conductive material on an active region;
forming third conductive material on the second conductive material;
forming another dielectric material on the third conductive material;
removing portions of the second conductive material, the third conductive material and the another dielectric material to form the first openings.

16. The method of claim 15, wherein the active region is a first active region, and
wherein the first openings are disposed on second and third active regions different from the first active region.

* * * * *